United States Patent [19]

Heaney et al.

[11] Patent Number: 5,107,523

[45] Date of Patent: Apr. 21, 1992

[54] PROCESSOR CLOCK GOVERNOR

[75] Inventors: Bradley G. Heaney, Mountain View; Jehanbux J. Edulbehram, Sunnyvale, both of Calif.

[73] Assignee: Intel Corporation, Santa Clara, Calif.

[21] Appl. No.: 625,847

[22] Filed: Dec. 11, 1990

[51] Int. Cl.⁵ .................. H03K 5/19; H03M 13/00; G06F 11/00

[52] U.S. Cl. ............................ 377/2; 377/28; 328/138; 307/518; 371/14; 371/62

[58] Field of Search ............... 377/2, 20, 28; 328/138; 307/518; 371/12, 14, 62

[56] References Cited

U.S. PATENT DOCUMENTS

| | | | |
|---|---|---|---|
| 3,757,233 | 9/1973 | Dixon | 328/138 |
| 4,220,010 | 9/1980 | Meisner et al. | 328/138 |
| 4,405,982 | 9/1983 | Ruhnau et al. | 371/62 |
| 4,586,180 | 4/1986 | Anders et al. | 377/28 |
| 4,752,930 | 6/1988 | Kitamura et al. | 371/62 |
| 4,882,545 | 11/1989 | Plant | 328/138 |

*Primary Examiner*—John S. Heyman
*Attorney, Agent, or Firm*—Blakely, Sokoloff, Taylor & Zafman

[57] ABSTRACT

An input to the control unit of a microprocessor places the microprocessor in a WAIT condition whenever the input clock frequency is determined to be greater than a predetermined maximum value. An RC circuit in combination with a Schmitt trigger generates a "kill signal" whenever the time interval between successive clock pulses is less than a value corresponding to a cut-off frequency. To assure that the microprocessor is not placed in a WAIT state by an occasional "glitch" on the clock input, the kill signal applied to the microprocessor control unit is provided from a four-bit counter. If the Schmitt trigger generates a kill signal on eight consecutive clock cycles, the counter output changes state and sequencing of microcode by the control unit is suspended.

11 Claims, 2 Drawing Sheets

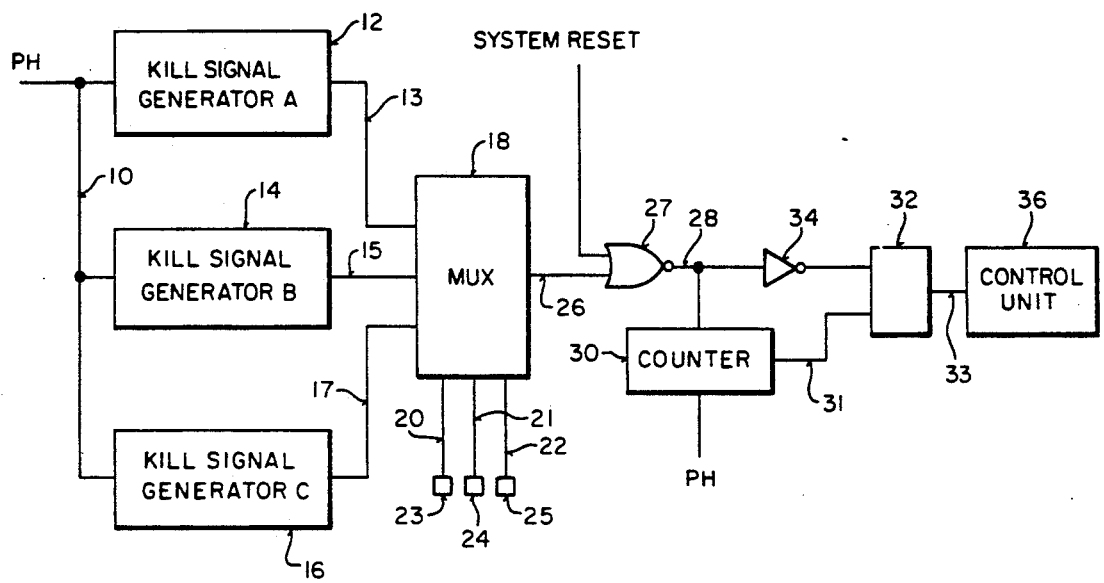
FIG_1
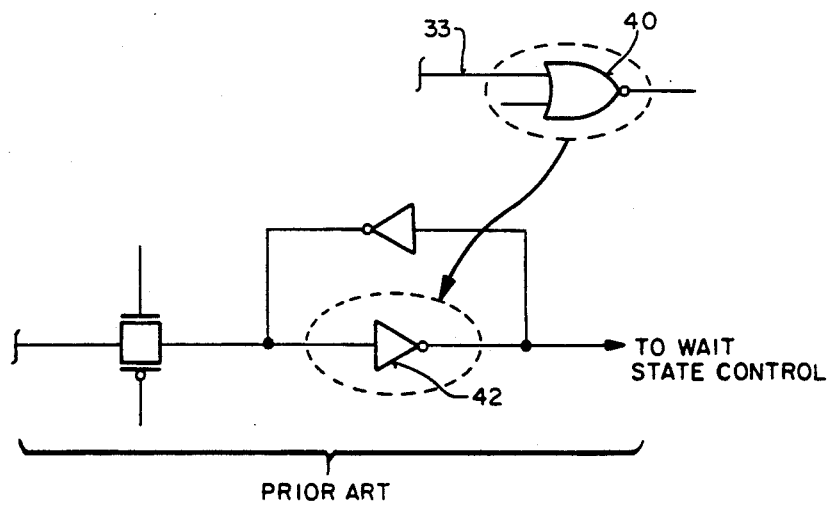
FIG_2
PRIOR ART

FIG_3
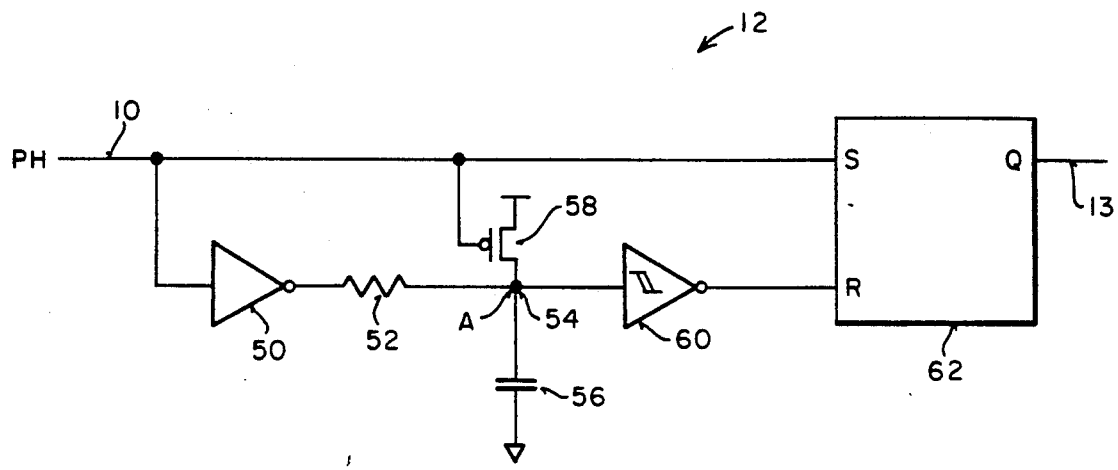
FIG_4
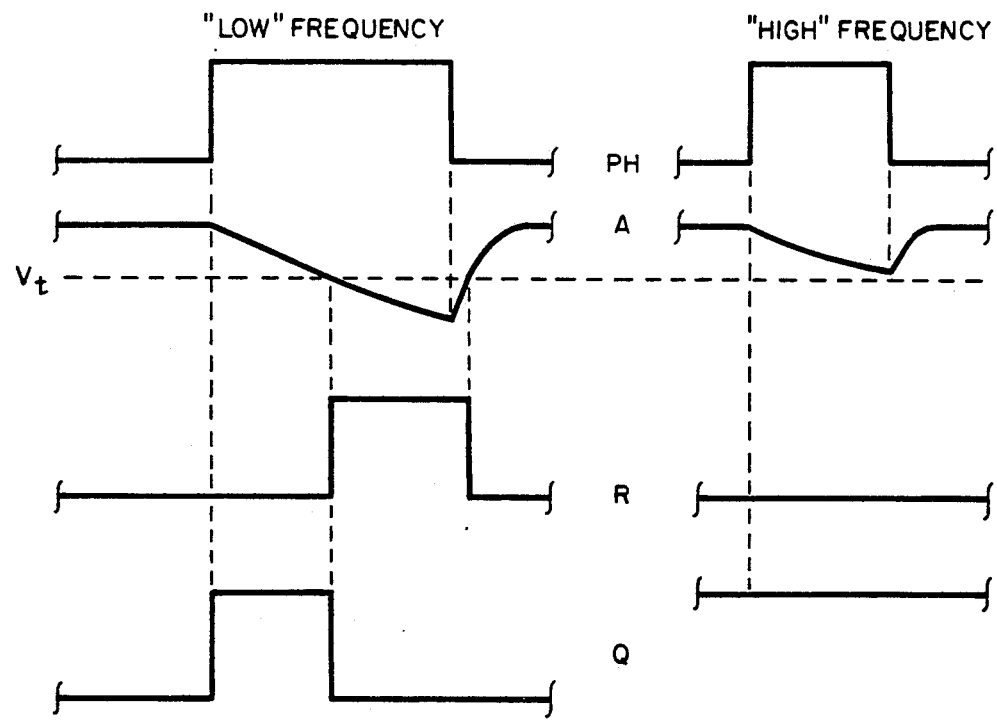

5,107,523

PROCESSOR CLOCK GOVERNOR

FIELD OF THE INVENTION

This invention relates to the field of microprocessor design, and in particular to a method and apparatus for regulating the operation of a microprocessor in response to an input clock frequency that is not in compliance with the processor specifications.

BACKGROUND OF THE INVENTION

Designers of microprocessor based systems are almost always seeking to increase the operating speed of the processor. Thus, in recent years, microprocessor specifications have offered ever-increasing operating speeds. However, for any given design of a microprocessor, manufacturing tolerances will affect the actual maximum speed at which the processor will operate reliably. Thus, particular microprocessor chips of a given design will likely have different maximum operating speeds. Accordingly, it is not uncommon in the industry to qualify microprocessor chips in several "grades" according to the maximum clock frequency at which they will operate. Thus, for example, certain chips of a single microprocessor design might be qualified for operation at a particular clock frequency, say 25 megahertz, while other chips might be qualified at lower frequencies, say 20 and 16 megahertz. Generally speaking, chips qualified at higher operating clock frequencies will command higher prices.

Typical microprocessor designs provide for a clock input to be provided by off-chip circuitry, usually comprising a crystal oscillator. Therefore, the microprocessor manufacturer has no direct control over the frequency of the clock signal that will be applied to the clock input of the microprocessor. While the maximum clock frequency of the microprocessor is specified by the manufacturer, a purchaser of a microprocessor chip may attempt to increase the performance of the microprocessor by applying a clock signal having a frequency higher than that which is specified as the maximum frequency. This can result in malfunction of the microprocessor and unpredictable data results. Such results may adversely reflect on the reputation of the microprocessor manufacturer. Accordingly, there is a need for a method and apparatus for governing the maximum operating speed of a microprocessor that is solely under the control of the chip manufacturer. Furthermore, there is a need for selecting one of a plurality of maximum operating speeds depending upon the qualification level of each particular chip.

SUMMARY OF THE INVENTION

The present invention provides an input to the control unit of a microprocessor to place the microprocessor in a WAIT condition whenever the input clock frequency is determined to be greater than a predetermined maximum value. An RC circuit in combination with a Schmitt trigger generates a "kill signal" whenever the time interval between successive clock pulses is less than a value corresponding to a cut-off frequency. To assure that the microprocessor is not placed in a WAIT state by an occasional "glitch" on the clock input, the kill signal applied to the microprocessor control unit is provided from a four-bit counter. If the Schmitt trigger generates a kill signal on eight consecutive clock cycles, the counter output changes state and sequencing of microcode by the control unit is suspended.

Since it is desirable to qualify microprocessor chips to several different maximum clock frequencies, a plurality of kill signal generators are provided with different cut-off frequencies corresponding to the different qualification levels of the microprocessor chips. The outputs of the individual kill signal generators are applied to a multiplexer. The selection lines of the multiplexer are coupled to bond pads of the microprocessor so that the appropriate cut-off frequency may be selected by the chip manufacturer at the time that the chip is packaged.

BRIEF DESCRIPTION OF THE DRAWINGS

FIG. 1 is a functional block diagram of a clock governor circuit according to the present invention.

FIG. 2 illustrates modification of a prior art microprocessor control unit for implemntation of the present invention.

FIG. 3 is a simplified circuit schematic of the kill signal generator of FIG. 1.

FIG. 4 illustrates the signal waveforms of the circuit of FIG. 3.

DETAILED DESCRIPTION OF THE INVENTION

In the following description, for purposes of explanation and not limitation, specific circuits, components, waveforms, etc. are set forth in order to provide a thorough understanding of the present invention. However, it will be apparent to one skilled in the art that the present invention may be practiced in other embodiments that depart from these specific details. In other instances, detailed descriptions of well known aspects of microprocessor systems and digital circuits are omitted so as to not obscure the description of the present invention with unnecessary detail.

FIG. 1 is a functional block diagram of an implementation of the present invention. A microprocessor clock signal PH is applied to line 10. This signal is one of the processor phase clock signals and in most microprocessor implementations, this will be at a frequency equal to one-half of the external clock frequency. The processor phase clock signal is applied to kill signal generators 12, 14 and 16, the details of which will be more fully described below. Each of the kill signal generators is tuned to a cut-off frequency such that a kill signal output is generated if the frequency of the input clock signal is greater than the cut-off frequency. In a preferred embodiment, kill signal generators 12, 14 and 16 are tuned to cut-off frequencies of 16, 20 and 25 megahertz, respectively. However, it will be understood that the kill signal generators may be tuned to any set of frequencies corresponding to performance thresholds of the microprocessor. Furthermore, while the present invention is described in terms of three kill signal generators, it will be understood that any number of such generators may be employed depending upon the desired number of qualification levels.

Kill signal generators 12, 14 and 16 provide kill signal outputs 13, 15 and 17, respectively, to multiplexer 18. Selection inputs 20, 21 and 22 select an input of multiplexer 18 to be applied to output 26. Three selection lines are employed to accommodate additional inputs to multiplexer 18. Selection lines 20, 21 and 22 are coupled to bond pads 23, 24 and 25, respectively. These pads are selectively coupled to $V_{cc}$ or ground at the time that the microprocessor chip is packaged as a function of the desired cut-off clock frequency. Thus, the cut-off frequency is determined by the manufacturer of the microprocessor and cannot be altered.

Output 26 of multiplexer 18 is asserted at an input of NOR gate 27, the other input of which is coupled to a system reset signal. Output 28 of NOR gate 27 is coupled to counter 30. In a preferred embodiment, counter 30 is a four-bit ripple counter comprising four D-type flip-flops. Line 28 is coupled to the reset input of each stage of the counter so that the counter is reinitialized whenever a positive going pulse is presented on line 28. The first stage of counter 30 is clocked by the processor phase clock signal and successive stages are clocked by the Q outputs of the preceding stage in conventional fashion. The Q output of the final stage is asserted on line 31. Thus, output 31 of counter 30 transitions to a logical high if and only if eight consecutive phase clock cycles occur at a frequency exceeding the cut-off frequency. Output signal 31 is therefore insensitive to occasional clock "glitches" that may trigger the selected kill signal generator. This prevents the processor from being halted accidentally due to a temporary change in the phase clock duty cycle.

Counter output 31 is asserted at SR latch 32. Latch 32 also receives counter reset signal 28 through inverter 34. Output 33 of SR latch 32 is asserted at control unit 36. Latch 32 allows the kill signal on line 33 to be reset during an externally generated system reset and will remain reset as long as the processor phase clock signal does not exceed the selected cut-off frequency. Latch 32 also allows resetting of the kill signal on line 33 when the frequency of the processor phase clock signal is reduced from above the cut-off frequency to a value below it.

Control unit 36 governs the operation of the microprocessor through execution of microcode. In an exemplary application of the present invention, illustrated in FIG. 2, the kill signal output of latch 32 on line 33 is coupled to an input of NOR gate 40. NOR gate 40 replaces an inverter 42 in the existing WAIT signal logic of the microprocessor. Thus, when a kill signal is asserted on line 33, the microprocessor control unit responds as if a WAIT condition is invoked and temporarily halts operation of the microprocessor. Operation will remain halted until input clock signal at line 10 is restored to a frequency below the selected cut-off frequency. In this fashion, the processor is halted in a non-catastrophic fashion so that it can resume operation when the proper clock signal is restored without the need for a system reset.

Referring now to FIG. 3, the operation of kill signal generator 12 will be described in greater detail, the operation of kill signal generators 14 and 16 being identical except for the characteristic values of certain circuit components. The processor phase clock signal on line 10 is coupled to the input of inverter 50, to the gate of transistor 58 and also to the set input of flip-flop 62. The output of inverter 50 is coupled to resistor 52, the opposite terminal of which is coupled to circuit junction 54. Junction point 54 is also coupled to the drain of transistor 58, capacitor 56 and the input of Schmitt trigger 60. The inverting output of Schmitt trigger 60 is coupled to the reset input of flip-flop 62. The Q output of flip-flop 62 is coupled to line 13.

In a preferred embodiment of the present invention implemented in connection with a CMOS microprocessor, resistor 52 and capacitor 56 are polycide elements. Tuning of the cut-off frequency in each of the kill signal generator circuits is accomplished during chip fabrication by changing the number of capacitive and resistive elements that are connected into the circuit by one of the metalization layers.

Referring also to FIG. 4, the operation of kill signal generator 12 will be described. When the processor phase clock signal is in a logical low state, transistor 58 is turned on, thereby rapidly charging capacitor 56 until signal "A" at junction point 54 is at a potential of $V_{cc}$. When the input clock signal goes to a logical high state, transistor 58 is switched off and capacitor 56 discharges through resistor 52 to the ground potential appearing at the output of inverter 50. The potential at junction point 54 decays at a rate determined by the values of capacitor 56 and resistor 52. If the input clock frequency has a "low" value, i.e., if the period of the clock signal is "long", the potential at junction point 54 will decay below threshold value $V_t$ causing the output of Schmitt trigger 60 to go to a logical high state. This resets flip-flop 62, and the Q output is forced to a logical low state. Referring briefly to FIG. 1, the transition to a low state of the Q output of flip-flop 62 on line 13 propagates to line 26 since it is presumed for purposes of this description that kill signal generator 12 is selected by multiplexer select lines 20–22. This causes the output of NOR gate 27 to transition to a logical high state, thereby resetting counter 30.

On the other hand, if the input clock signal has a "high" frequency, i.e., if the clock period is "short", junction point 54 will not discharge below the threshold frequency of the Schmitt trigger and a reset signal will not be applied to flip-flop 62. Flip-flop 62 will remain in a set condition with the Q output at a logical high state. Referring back again to FIG. 1, this condition causes the output of NOR gate 27 to remain at a logical low state allowing counter 30 to count up.

It will be recognized that the above described invention may be embodied in other specific forms without departing from the spirit or essential characteristics of the disclosure. Thus, it is understood that the invention is not to be limited by the foregoing illustrative details, but rather is to be defined by the appended claims.

We claim:

1. In a processor having a processor clock signal comprising a cyclical sequence of clock pulses and a control unit for executing microcode to control operation of the processor, an apparatus for governing operation of the processor comprising:
   first circuit means for receiving said processor clock signal and generating a first signal when the interval between any pair of successive clock pulses is less than a predetermined value;
   second circuit means for counting successive occurrences of said first signal and generating a second signal when a predetermined number of consecutive occurrences of said first signal have been counted;
   third circuit means responsive to said second signal for suspending operation of the processor.

2. The device of claim 1 wherein said first circuit means is one of a plurality of such means, each for generating a respective first signal when the interval between successive clock pulses is less than a respective predetermined value.

3. The device of claim 2 further comprising multiplexer means coupled between said plurality of first circuit means and said second circuit means for selecting one of said plurality of first signals for presentation to said second circuit means.

4. The device of claim 1 wherein said first circuit means comprises an RC circuit coupled to a Schmitt trigger.

5. The device of claim 4 wherein said RC circuit comprises polycide resistor and capacitor elements.

6. The device of claim 1 wherein said apparatus and said processor are located on a single circuit chip.

7. The device of claim 1 wherein said second circuit means comprises a ripple counter clocked by said processor clock signal and wherein absence of said first signal causes said ripple counter to be reset.

8. The device of claim 7 wherein said ripple counter is a four-bit counter.

9. The device of claim 1 wherein said third circuit means is coupled to said control unit and said second signal causes execution of microcode in said control unit to halt.

10. In a processor having a processor clock signal comprising a cyclical sequence of clock pulses and a control unit for executing microcode to control operation of the processor, a method for governing the operation of the processor comprising the steps of:
   generating a first signal when the interval between any pair of successive clock pulses is less than a predetermined value;
   counting successive occurrences of said first signal;
   generating a second signal when a predetermined number of consecutive occurrences of said first signal have been counted;
   suspending operation of the processor upon generation of said second signal.

11. The method of claim 10 wherein the operation of the processor is suspended by halting execution of microcode in said control unit.

* * * * *